(12) United States Patent
Yu et al.

(10) Patent No.: US 8,090,069 B2
(45) Date of Patent: Jan. 3, 2012

(54) APPARATUS FOR GENERATING CLOCK SIGNAL WITH JITTER AND TEST APPARATUS INCLUDING THE SAME

(75) Inventors: Bong Guk Yu, Daejeon (KR); Eun Tae Kim, Daejeon (KR); Hyung Jung Kim, Daejeon (KR); Gweon Do Jo, Daejeon (KR)

(73) Assignee: Electronics and Telecommunication Research Institute, Daejeon (KR)

( * ) Notice: Subject to any disclaimer, the term of this patent is extended or adjusted under 35 U.S.C. 154(b) by 660 days.

(21) Appl. No.: 12/142,396

(22) Filed: Jun. 19, 2008

(65) Prior Publication Data
US 2009/0316848 A1 Dec. 24, 2009

(30) Foreign Application Priority Data

Dec. 17, 2007 (KR) ........................ 10-2007-0132802

(51) Int. Cl.
*H03D 3/24* (2006.01)
(52) U.S. Cl. ...................................... 375/376; 375/373
(58) Field of Classification Search .................... 375/376
See application file for complete search history.

(56) References Cited

U.S. PATENT DOCUMENTS

| | | | |
|---|---|---|---|
| 4,926,447 A * | 5/1990 | Corsetto et al. | 375/376 |
| 6,208,691 B1 * | 3/2001 | Balakrishnan et al. | 375/240.12 |
| 2002/0064177 A1 * | 5/2002 | Bertram et al. | 370/458 |
| 2002/0159554 A1 * | 10/2002 | Nosaka et al. | 375/376 |
| 2003/0142775 A1 * | 7/2003 | Takeshita et al. | 375/376 |
| 2004/0157555 A1 * | 8/2004 | Richenstein et al. | 455/39 |
| 2004/0198237 A1 * | 10/2004 | Abutaleb et al. | 455/78 |
| 2006/0184332 A1 * | 8/2006 | Ishida et al. | 702/69 |
| 2008/0151981 A1 * | 6/2008 | Ichiyama et al. | 375/226 |
| 2008/0215777 A1 * | 9/2008 | Richenstein et al. | 710/69 |

FOREIGN PATENT DOCUMENTS

| | | |
|---|---|---|
| JP | 2004-208020 | 7/2004 |
| KR | 1995-0005021 | 2/1995 |
| KR | 10-2007-0012996 | 1/2007 |
| KR | 10-2007-0030915 A | 3/2007 |
| KR | 10-2007-0043843 | 4/2007 |
| KR | 10-2007-0043843 A | 4/2007 |

OTHER PUBLICATIONS

Korean Notice of Allowance dated Apr. 22, 2010 and issued in corresponding Korean Patent Application 10-2007-0132802.
Bong-Guk Yu, et al. "Jitter Effect on a Digital If Transceiver for SDR-based Mobile Communcaiton Base Station."
Korean Notice of Allowance mailed Oct. 13, 2009 in corresponding Korean Patent Application 10-2007-0132802.

* cited by examiner

*Primary Examiner* — David C. Payne
*Assistant Examiner* — Erin File
(74) *Attorney, Agent, or Firm* — Staas & Halsey LLP

(57) ABSTRACT

The present invention relates to an apparatus for generating a clock signal with jitter and a test apparatus including the same. The apparatus for generating a clock signal with jitter in accordance with the present invention includes a voltage-controlled crystal oscillator (VCXO) for generating an output signal including jitter components based on a driving power source having a specific waveform and a controlled voltage, a phase comparator for calculating a phase difference of a reference signal and the output signal, and a loop filter for generating the controlled voltage based on the phase difference calculated by the phase comparator. Accordingly, the PLL circuit unit generates a clock signal including jitter, so that the complexity and manufacturing cost of the apparatus can be reduced.

14 Claims, 5 Drawing Sheets

APPARATUS FOR GENERATING CLOCK SIGNAL WITH JITTER AND TEST APPARATUS INCLUDING THE SAME

CROSS-REFERENCE TO RELATED APPLICATIONS

This application claims the benefit of Korean Application No. 10-2007-0132802, filed Dec. 17, 2007, in the Korean Intellectual Property Office, the disclosure of which is incorporated herein by reference.

BACKGROUND OF THE INVENTION

1. Field of the Invention

The present invention relates to an apparatus for generating a clock signal with jitter and a test apparatus including the same and, more particularly, to an apparatus for generating a clock signal with jitter, which can output clock jitter by applying the sum of a signal having a specific waveform, which is generated from a waveform generator, and a power source signal to a phase-locked loop (PLL) circuit unit as a power source, and a test apparatus including the same.

The present invention has been induced from researches made as a part of IT Growth Power Technology Development by Ministry of Information and Communication and Institute for Information Technology Advancement, Republic of Korea, [Project Management No.: 2006-S-001-02, Project Name: Development of Adaptive Wireless Access and Transmission Technology for Fourth-Generation Mobile Communication].

2. Discussion of Related Art

Clock jitter is a distorted clock signal, which appears as an ideal clock signal transits fast or slowly from a reference point as much as a specific time. Clock jitter can be generated due to a system-inherent problems, such as crosstalk and impedance mismatch, data-inherent characteristics such as inter-symbol interference and cyclic distortion, and/or random noise such as heat noise.

In a reliability test of a specific device, a test on a case where clock jitter is applied is indispensable. Jitter can be generated by a variety of factors, such as system problems, applied data problems, and/or noise. In the case in which clock jitter is applied, clock jitter must be applied to a device using an artificial apparatus for generating a clock signal with jitter so as to test the stability of an output signal of the device.

A general apparatus for generating a clock signal with jitter is configured to separate low frequency components and high frequency components from predetermined jitter data, control an oscillation frequency of an oscillation circuit unit according to the jitter data of the low frequency components, and control the delay amount of an oscillation signal according to the jitter data of the high frequency components. However, if the above method is used, the device must include a digital-to-analog converter (DAC) for converting jitter data into analog data, and a filter for filtering low frequency components and high frequency components from jitter data. Accordingly, the complexity of the device can be increased.

SUMMARY OF THE INVENTION

It is, therefore, an object of the present invention to provide an apparatus for generating a clock signal with jitter, which can generate an output signal with jitter by controlling a power source signal applied to a PLL circuit unit that generates the output signal, and a test apparatus including the same.

In accordance with an embodiment of the present invention, there is provided an apparatus for generating a clock signal with jitter, including a voltage-controlled crystal oscillator (VCXO) for generating an output signal including jitter components based on a driving power source having a specific waveform and a controlled voltage, a phase comparator for calculating a phase difference of a reference signal and the output signal, and a loop filter for generating the controlled voltage based on the phase difference calculated by the phase comparator.

In accordance with another embodiment of the present invention, there is provided a jitter tolerance test apparatus, including a clock jitter generator for generating an output signal, including jitter components, based on a driving power source having a specific waveform and a reference signal, a first signal analyzer for measuring an amount of the jitter components of the output signal, a second signal analyzer for measuring an output signal of a device, wherein the output signal of the device corresponds to the output signal of the clock jitter generator, which is input to the device, and a determination unit for measuring jitter tolerance of the device by employing a result of the first signal analyzer and the second signal analyzer.

In accordance with further another embodiment of the present invention, there is provided a method of operating an apparatus for generating a clock signal with jitter, including the steps of generating an output signal, including jitter components, based on a driving power source having a specific waveform and a controlled voltage, calculating a phase difference of a reference signal and the output signal, and generating the controlled voltage based on the calculated phase difference.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE EMBODIMENTS

Hereinafter, embodiments of the present invention will be described in detail with reference to the accompanying drawings so that they can be readily implemented by those skilled in the art.

Figure 1:
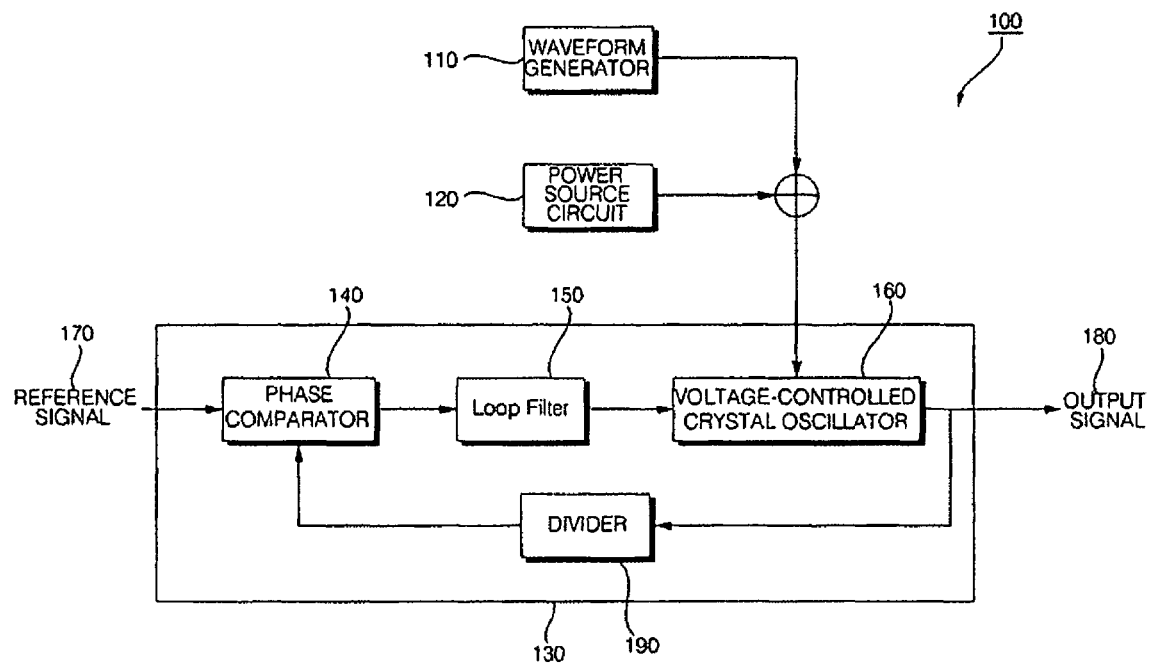
FIG. 1 is a configuration showing an apparatus for generating a clock signal with jitter in accordance with an embodiment of the present invention.

FIG. 1 is a configuration showing an apparatus for generating a clock signal with jitter in accordance with an embodiment of the present invention. As shown in FIG. 1, an apparatus for generating a clock signal with jitter 100 in accordance with the present invention includes a waveform generator 110, a power source circuit 120, and a phase-locked loop (PLL) circuit unit 130 that is operated according to a power source signal applied from the power source circuit 120.

The waveform generator 110 is a device which can play a predetermined waveform or generate specific waveforms by performing digital-to-analog (DA) conversion on various waveforms, and can set the amplitude, frequency, etc. of an output waveform, as desired. Further, the waveform generator 110 can output a waveform having various sampling clocks. Here, the frequency of the output waveform is decided according to a sampling clock and a memory length.

The power source circuit 120 is a circuit for outputting DC power and can employ a typical DC voltage/current output circuit. A power source signal output from the power source circuit 120 is added to an output waveform of the waveform generator 110 and then input to the PLL circuit unit 130 as a driving power source.

The PLL circuit unit 130 is a circuit for matching a reference signal 170, which is input to the PLL circuit unit 130, and the frequency of an output signal 180 output from the PLL circuit unit 130. The PLL circuit unit 130 includes a phase comparator 140 for comparing phases of the reference signal 170 and the output signal 180, a loop filter 150 for converting a phase difference of the reference signal 170 and the output signal 180, which have been compared by the phase comparator 140, into voltage, and a voltage-controlled crystal oscillator (VCXO) 160 for generating the output signal 180 by employing the voltage converted by the loop filter 150.

The phase comparator 140 calculates a phase difference of the reference signal 170 and the output signal 180 and transmits a calculation result to the loop filter 150. At this time, when the reference signal 170 is a signal of a low frequency band and the output signal 180 is a signal of a high frequency band, a divider 190 for converting the output signal 180 of the high frequency into a signal of a low frequency in order to compare the reference signal 170 and the output signal 180 can be used. The output signal 180 of a high frequency is converted into a signal of a low frequency by the divider 190 and then input to the phase comparator 140. The output signal 180 output from the PLL circuit unit 130 can be a signal of a high frequency, whereas the reference signal 170 can be a signal of a low frequency. A signal of a low frequency can be output as a constant frequency by employing a vibrator having an excellent vibration characteristic such as crystal. Accordingly, a low frequency signal having a constant frequency is employed as the reference signal 170, and the output signal 180 of a high frequency is converted into a signal of a low frequency by the divider 190. Thus, the phase comparator 140 can easily detect a phase difference of the reference signal 170 and the output signal 180.

The loop filter 150 receives the phase difference detected by the phase comparator 140. The loop filter 150 is a kind of a low-pass filter (LPF), and integrates the phase difference detected by the phase comparator 140 and converts the integrated result into a controlled voltage having a specific value. Since the reference signal 170 of a low frequency band and the output signal 180, which has been converted into a signal of a low frequency by the divider 190, are compared by the phase comparator 140, a signal of a high frequency band is precluded in the phase difference input to the loop filter 150.

The loop filter 150 can convert the phase difference, which is input from the phase comparator 140, into a controlled voltage having a specific value. The controlled voltage converted by the loop filter 150 is input to the VCXO 160. The VCXO 160 generates the output signal 180 having a constant frequency according to an input controlled voltage. The loop filter 150 integrates the phase difference, which is input from the phase comparator 140, using a charge pump and converts an integrated result into a controlled voltage.

The VCXO 160 is an oscillator that generates the output signal 180 having a frequency of a specific value according to the controlled voltage, which has been converted by the loop filter 150, and a driving voltage generated by the waveform generator 110 and the power source circuit 120. The VCXO 160 receives the sum of a signal, which is output from the power source circuit 120, and a waveform, which is output from the waveform generator 110, as a driving voltage. The VCXO 160 outputs the output signal 180 of a constant frequency based on an input driving voltage and a controlled voltage converted by the loop filter 150.

The driving voltage does not include the waveform output from the waveform generator 110 and therefore has an irregular value. The waveform output from the waveform generator 110 can include a specific noise signal. The noise signal can be generated by a given amplifier. The output signal 180 of the VCXO 160 has a different frequency according to an input controlled voltage and a driving voltage and converts the driving voltage using the waveform generator 110, so that it can output the output signal 180 having jitter components.

Figure 2:
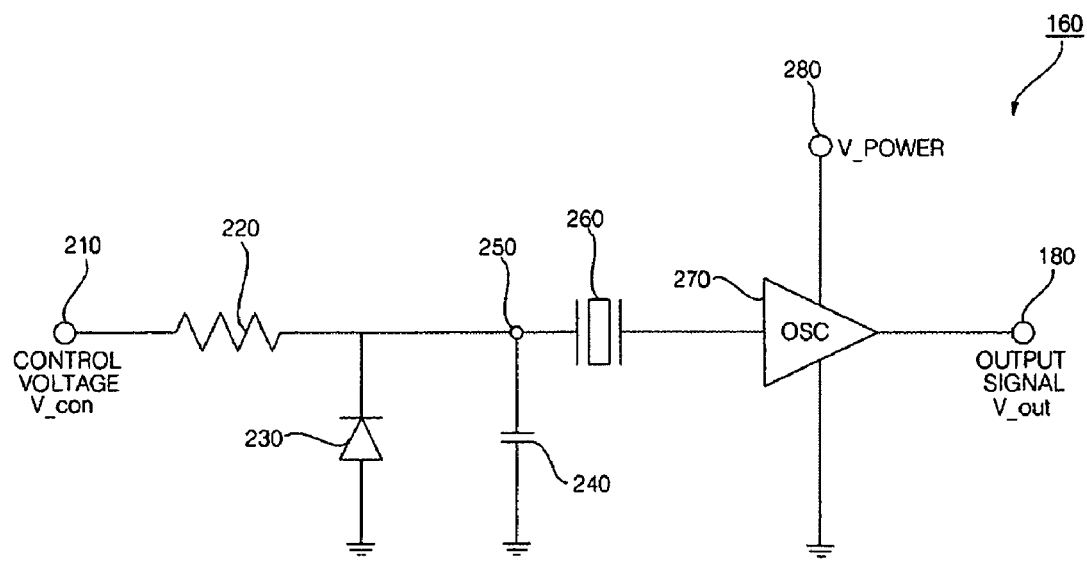
FIG. 2 is a configuration showing a VCXO in accordance with an embodiment of the present invention.

FIG. 2 is a configuration showing the VCXO in accordance with an embodiment of the present invention.

As shown in FIG. 2, the VCXO 160 in accordance with the present invention receives a controlled voltage V_con 210 having a specific value and a driving voltage V_POWER 280 and outputs an output signal V_out 180.

The controlled voltage 210 is the result of the phase difference calculated by the phase comparator 140, which has been converted into voltage by the loop filter 150, and can have a constant value. The controlled voltage 210 is transferred to a terminal to which a varactor diode 230 and a capacitor 240 are connected in parallel through a resistor 220. The varactor diode 230 is a diode, which is biased in a backward direction, and can have a different capacitance according to voltage of a first node 250. In other words, the varactor diode 230 can operate as an accumulator together with the capacitor 240.

A crystal module 260 is connected between the first node 250 and an oscillator (OSC) 270 and can operate as an inductor having a high quality factor. The high quality factor of the crystal module 260 can contribute to the VCXO 160 that outputs a stabilized signal at a high frequency band. The crystal module 260 can be represented by a R-L-C circuit that is connected in series and a parallel circuit of a capacitor. The quality factor of the crystal module 260 is represented by an inverse number of a product of resistance and reactance of the crystal module 260 within a range of an operating frequency. Since a crystal quality factor typically has a high value of 20,000 to 200,000, the stability of a signal at a high frequency band can be increased by employing the crystal module 260.

The oscillation circuit 270 receives voltage that has passed through the crystal module 260. The oscillation circuit 270 may be an amplifier including at least one inverter circuit and is operated by the driving voltage V_POWER 280. The oscillation circuit 270 receives voltage that has passed through the crystal module 260 and generates the output signal 180 of the PLL circuit unit 130. Hereinafter, an operation of the oscillation circuit 270 is described in detail with reference to FIG. 3.

Figure 3:
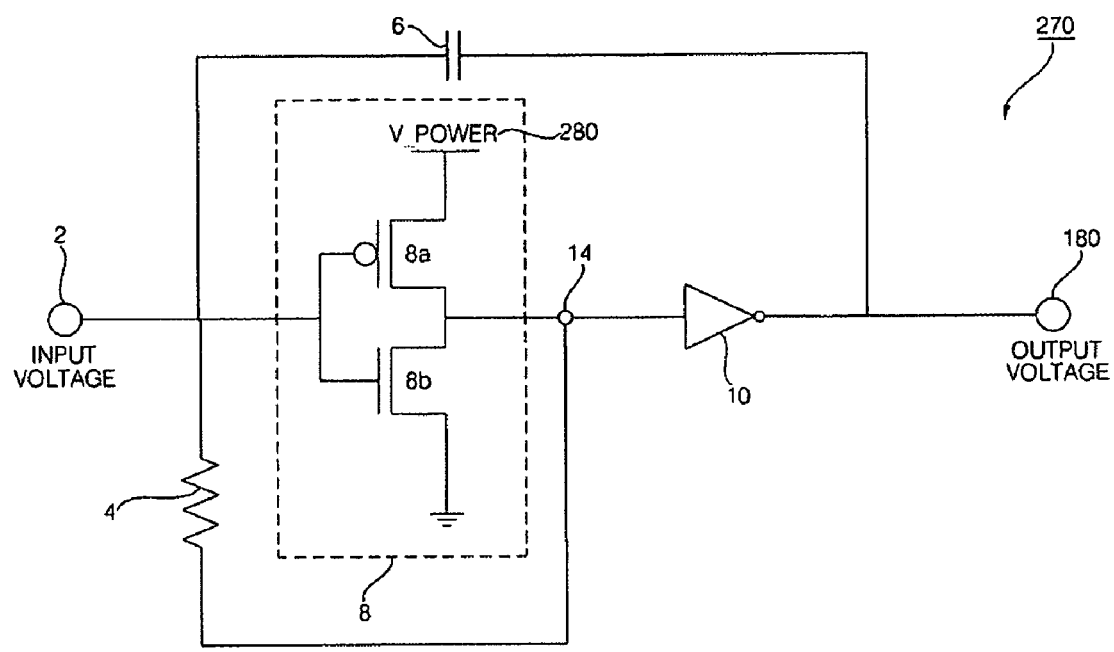
FIG. 3 is a configuration showing an oscillation circuit included in the VCXO in accordance with an embodiment of the present invention.

FIG. 3 is a configuration showing the oscillation circuit included in the VCXO in accordance with an embodiment of the present invention.

As shown in FIG. 3, the oscillation circuit 270 in accordance with the present invention includes a first inverter 8, and a second inverter 10 coupled to the first inverter. The oscillation circuit 270 receives an input voltage 2 that has passed through the crystal module 260 and generates the output signal 180.

The first inverter 8 can include a P-channel FET 8a and an N-channel FET 8b. The P-channel FET 8a is coupled to the driving voltage V_POWER 280 input from the power source circuit 120. The input voltage 2 is coupled to a gate electrode of the P-channel FET 8a and a gate electrode of the N-channel FET 8b. The first inverter 8 outputs a voltage of a low level when the input voltage 2 is determined to be a high level and outputs a voltage of a high level when the input voltage 2 is determined to be a low level.

A second node 14 to which a drain electrode of the P-channel FET 8a and a drain electrode of the N-channel FET 8b are coupled is coupled to an input terminal of the second inverter 10. That is, the output of the second inverter 10 of the oscillation circuit 270 becomes the output signal 180. The frequency of the output signal 180 is defined as in Equation 1 and Equation 2.

$$f = \frac{1}{-RC \times \ln B}$$ [Equation 1]

$$B = \frac{V_t(V_{POWER} - V_t)}{(V_{POWER} + V_t) \times (2V_{POWER} - V_t)}$$ [Equation 2]

In Equation 1 and Equation 2, R and C denote values a resistor 4 and a capacitor 6, included in the oscillation circuit 270. Vt denotes the threshold voltage of the FETs 8a and 8b included in the first inverter 8. V_POWER denotes the driving voltage 280 which is input from the power source circuit 120 to a source electrode of the P-channel FET 8a. Therefore, the frequency of the output signal 180 output from the oscillation circuit 270 can be decided according to a characteristic of a device included in the oscillation circuit 270 and the driving voltage 280 input from the power source circuit 120.

The driving voltage 280 is decided as the sum of an output signal of the power source circuit 120 and a waveform output from the waveform generator 110. Therefore, the sum of the output signal having a constant value, which is output from the power source circuit 120, and a specific waveform output from the waveform generator 110 decides the driving voltage 280. Accordingly, the frequency of the output signal 180 output from the oscillation circuit 270 included in the VCXO 160 of the PLL circuit unit 130 can be controlled, and jitter components can be included in the output signal 180.

The waveform output from the waveform generator 110 can be a specific waveform and can include a specific noise signal, so that the output signal 180 having various jitter components can be generated. Accordingly, the present invention can easily generate the output signal 180 including jitter components by controlling only the driving voltage 280 without using a filter for filtering the frequency of jitter data and a digital-to-analog converter (DAC).

Figure 4:
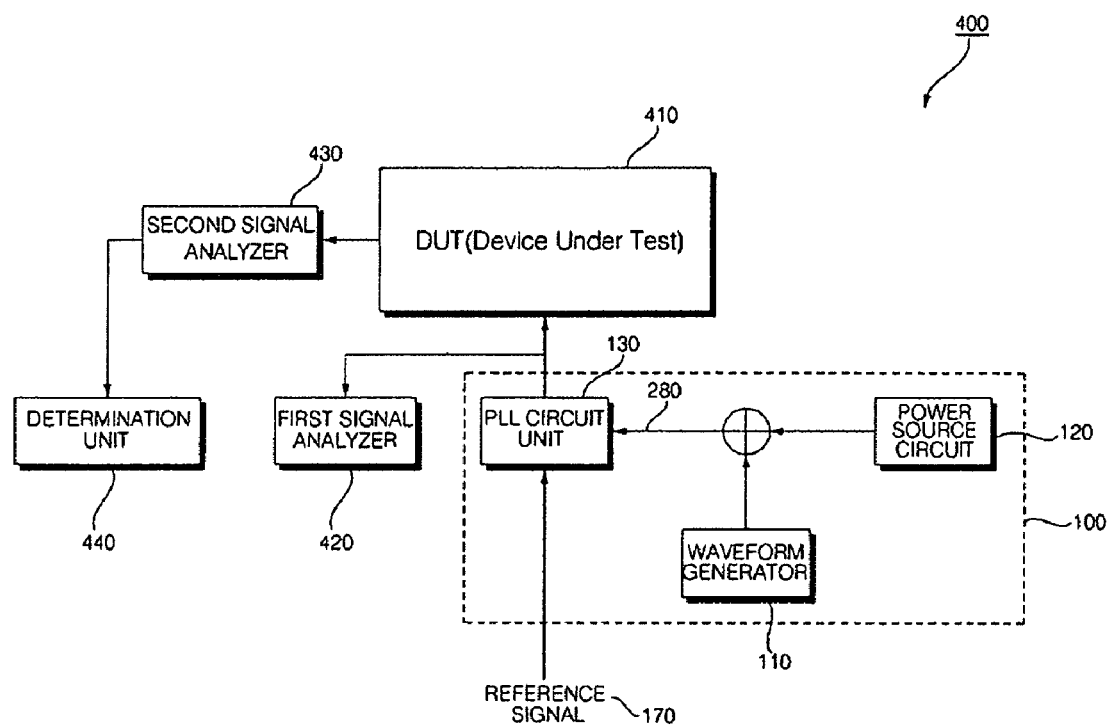
FIG. 4 is a configuration showing a jitter tolerance test apparatus in accordance with an embodiment of the present invention.

FIG. 4 is a configuration showing a jitter tolerance test apparatus in accordance with an embodiment of the present invention.

As shown in FIG. 4, a jitter tolerance test apparatus 400 in accordance with the present invention includes a device under test (DUT) 410, a clock jitter generator 100 for applying a clock signal, including jitter components, to the DUT 410, a first signal analyzer 420 for analyzing the output signal of the clock jitter generator 100, and a second signal analyzer 430 for analyzing the output signal of the DUT 410 according to an applied clock signal.

The DUT 410 is a DUT whose tolerance will be tested when a clock signal including jitter components is applied thereto and can include a variety of electronic devices. For example, the DUT 410 can be a radio frequency (RF) communication apparatus operating at a high frequency band. In the case of the RF communication apparatus, in particular, an apparatus operating on the receiver side, tolerance according to jitter components of a signal, which is transmitted by a transmitter-side apparatus, is an important factor to decide the reliability of a product. Accordingly, the jitter tolerance test apparatus 400 in accordance with the present embodiment can be applied effectively.

The clock jitter generator 100 is an apparatus that artificially includes jitter components in the output signal 180 by controlling a driving voltage. The clock jitter generator 100 can include a power source circuit 120 for supplying power source, a waveform generator 110 for applying a specific waveform to the power source supplied from the power source circuit 120, and a PLL circuit unit 130 for outputting a clock signal, including jitter components, according to a driving voltage 280 including the specific waveform.

The power source circuit 120 is typically a circuit for supplying constant power The waveform generator 110 is an apparatus that can generate an unspecified waveform. In particular, the specific waveform generated from the waveform generator 110 is added to the power source output from the power source circuit 120 and then applied to the PLL circuit unit 130 as the driving voltage 280. As an embodiment, the waveform generated from the waveform generator 110 can include a specific noise signal.

The PLL circuit unit 130 can include a divider, a phase comparator, a loop filter, a VCXO, and so on. The PLL circuit unit 130 compares a phase difference of the output signal 180 and the reference signal 170 by employing a negative feedback and outputs an output signal having a specific frequency according to a voltage-controlled method. As an embodiment, the phase comparator compares a specific reference signal and an output signal to calculate a phase difference, and the loop filter integrates the phase difference and converts the integrated result into voltage. If the converted voltage value is applied to the VCXO as a controlled voltage, the VCXO outputs the output signal 180 as a frequency, which is decided according to the controlled voltage and the driving voltage 280 input to the PLL circuit unit 130.

The first signal analyzer 420 analyzes the output signal 180 of the PLL circuit unit 130. In particular, the first signal analyzer 420 can provide a criterion necessary to measure jitter tolerance of the DUT 410 by measuring the amount of jitter components included in the output signal 180 of the PLL circuit unit 130. The first signal analyzer 420 receives the output signal 180 of the PLL circuit unit 130, measures the amount of jitter components.

The second signal analyzer 430 measures a signal output from the DUT 410. As an embodiment the second signal analyzer 430 can be a vector spectrum analyzer (VSA), which can measure a modulation characteristic of a signal output from the DUT 410. The second signal analyzer 430 analyzes a signal output from the DUT 410 and transmits the analysis result to the determination unit 440.

A determination unit 440 determines jitter tolerance of the DUT 410 according to a signal including jitter components applied to the DUT 410. As an embodiment, the determination unit 440 can determine whether the DUT 410 normally operates every amplitude of the jitter component by comparing a signal, which is output from the DUT 410, and a previously stored expected value signal every amplitude of jitter components measured by the first signal analyzer 420. The expected value signal can be a signal output from the DUT 410 when an ideal signal is input.

In the jitter tolerance test apparatus 400 in accordance with the present invention, the clock jitter generator 100 is configured in such a manner that a specific waveform, which is output from the waveform generator 110, is added to the power source output from the power source circuit 120 and then input to the PLL circuit unit 130 as the driving voltage 280, and the output signal 180 output from the PLL circuit unit 130 includes jitter components according to the driving voltage 280. Accordingly, the jitter tolerance test apparatus 400, which is cheaper and has a simple structure, can be provided, and the amount of jitter components included in the output signal 180 of the clock jitter generator 100 can be controlled according to a waveform output from the waveform generator 110.

Figure 5:
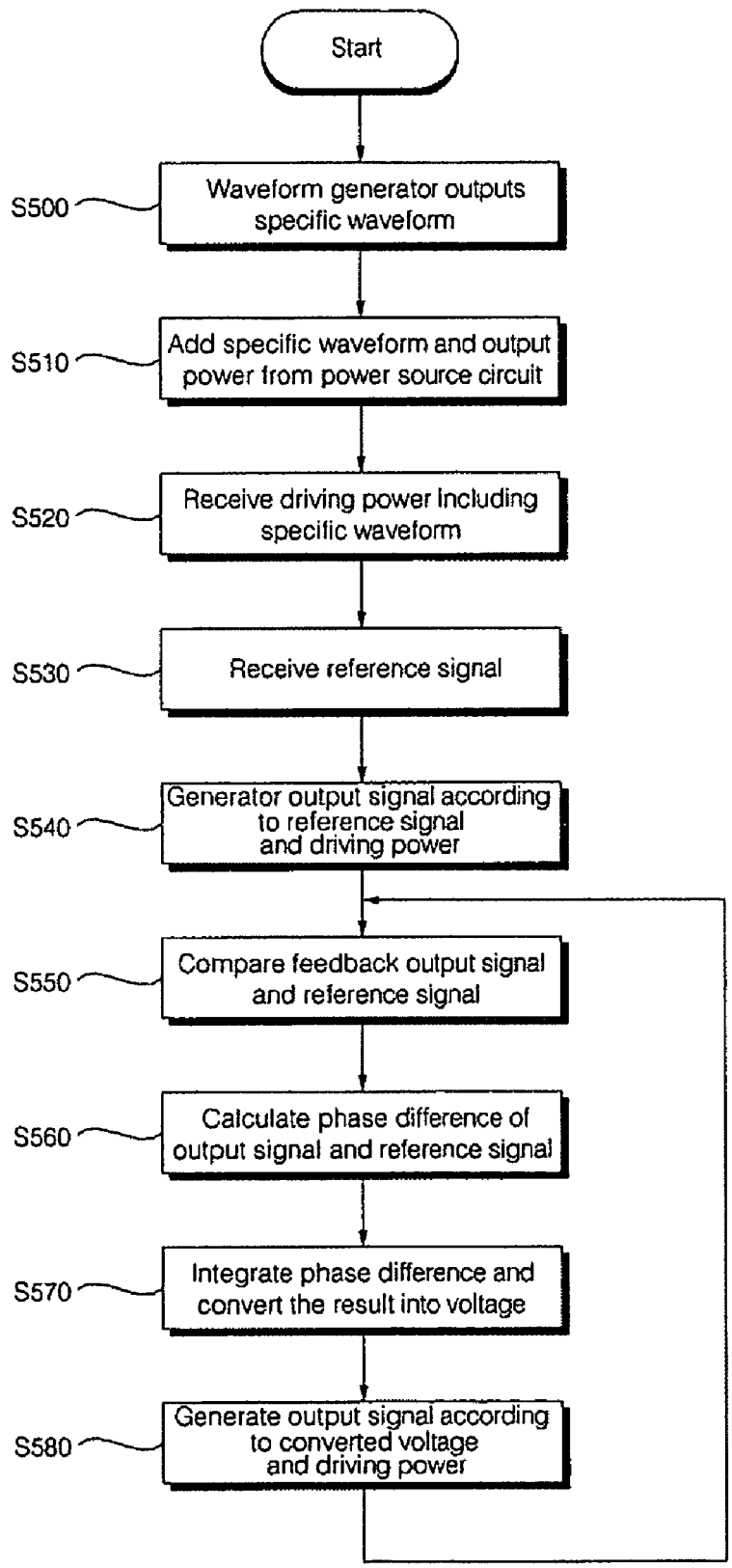
FIG. 5 is a flowchart illustrating a method of operating an apparatus for generating a clock signal with jitter in accordance with an embodiment of the present invention.

FIG. 5 is a flowchart illustrating a method of operating an apparatus for generating a clock signal with jitter in accordance with an embodiment of the present invention.

Referring to FIG. 5, first, the waveform generator 110 generates a specific waveform in step S500. The specific waveform generated by the waveform generator 110 in step S500 is added to an output power output from the power source circuit 120 in step S510.

The PLL circuit unit 130 receives the sum of the specific waveform and the output power as a driving power source in step S520. As an embodiment, the specific waveform can include a noise signal. The driving power source applied to the PLL circuit unit 130 is applied as a driving power source of the VCXO 160, so that the output signal 180 output from the PLL circuit unit 130 can include jitter components.

The PLL circuit unit 130 receives a specific reference signal 170 so as to generate the output signal 180 in step S530 and generates the output signal 180 including jitter components based on the reference signal 170 and the driving power source, which is received in step S520, in step S540. The frequency of the output signal 180 output from the PLL circuit unit 130 is decided according to not only the reference signal 170, but also the driving power source according to the Equation 1 and Equation 2. Accordingly, the output signal 180 including jitter components can be generated by adding the specific waveform to the driving power source.

The PLL circuit unit 130 receives the feedback output signal 180 and compares phases of the reference signal 170 and the output signal 180 using the phase comparator 140 in step S550 in order to calculate a phase difference in step S560. The phase difference calculated in step S560 is input to the loop filter 150. The loop filter 150 integrates the phase difference calculated in step S560, converts the integrated result into a voltage value in step S570, and inputs the converted voltage to the VCXO 160.

The VCXO 160 can output the output signal 180 according to the converted voltage and the driving power source in step S580. That is, the output signal 180 is feedback, the feedback output signal 180 is compared with the reference signal 170 so as to calculate a phase difference, the calculated phase difference is converted into voltage, and the converted voltage is input to the VCXO 160. Accordingly, the output signal 180 including various jitter components, if appropriate, can be generated.

The method of the present invention as described above can be implemented as a program and stored in a recording medium (CD ROM, RAM, ROM, a floppy disk, a hard disk, an optical magnetic disk, etc.) in a computer-readable form. This process can be easily implemented by those having ordinary skill in the art and will not be described in detail.

According to the present invention, the PLL circuit unit that generates an output signal generates a clock signal, including jitter, by controlling a power source signal applied thereto. Accordingly, the complexity and manufacturing cost of an apparatus for generating a clock signal with jitter can be reduced.

The present invention can provide an apparatus for generating a clock signal with jitter, which can generate an output signal with jitter by controlling a power source signal, and a test apparatus including the same.

While the invention has been shown and described with respect to the preferred embodiments, it will be understood by those skilled in the art that various changes and modifications may be made without departing from the spirit and scope of the invention as defined in the following claims.

What is claimed is:

1. An apparatus for generating a clock signal with jitter, comprising:
    a voltage-controlled crystal oscillator (VCXO) to generate an output signal including jitter components based on a driving power source having a specific waveform and a controlled voltage;
    a phase comparator to generate a phase difference of a reference signal and the output signal;
    a loop filter to generate the controlled voltage based on the phase difference calculated by the phase comparator;
    a power source circuit to output a power source; and
    a waveform generator to output the specific waveform,
    wherein the driving power source is a sum of the waveform output from the waveform generator and the power source output from the power source circuit.

2. The apparatus of claim 1, further comprising a divider for dividing the output signal output from the VCXO at a specific divide ratio and using the divided signal as an output signal input to the phase comparator.

3. The apparatus of claim 1, wherein the specific waveform has various sampling clocks.

4. The apparatus of claim 1, wherein the specific waveform includes a specific noise signal.

5. A jitter tolerance test apparatus, comprising:
    a clock jitter generator to generate an output signal, including jitter components, based on a driving power source having a specific waveform and a reference signal; a first signal analyzer to measure an amount of the jitter components of the output signal;
    a second signal analyzer to measure an output signal of a device, wherein the output signal of the device corresponds to the output signal of the clock jitter generator, which is input to the device; and
    a determination unit to measure jitter tolerance of the device by employing a result of the second signal analyzer, wherein the driving power source is a sum of the waveform output from a waveform generator and the power source outputs from the power source circuit.

6. The jitter tolerance test apparatus of claim 5, wherein the determination unit compares the output signal of the device and a specific expected value signal of an amplitude of the jitter components.

7. The jitter tolerance test apparatus of claim 5, wherein the clock jitter generator comprises:
    a phase comparator to calculate a phase difference of the reference signal and the output signal;
    a loop filter to generate a controlled voltage based on the phase difference calculated by the phase comparator; and a VCXO to generate the output signal, including jitter components, based on the driving power source and the controlled voltage.

8. The jitter tolerance test apparatus of claim 7, wherein the clock jitter generator further comprises a divider for dividing the output signal output from the VCXO at a specific divide ratio and using the divided signal as an output signal input to the phase comparator.

9. The jitter tolerance test apparatus of claim 5, wherein the specific waveform has various sampling clocks.

10. The jitter tolerance test apparatus of claim 5, wherein the specific waveform includes a specific noise signal.

11. A method of operating an apparatus for generating a clock signal with jitter, the method comprising:

generating an output signal, including jitter components, based on a driving power source having a specific waveform and a controlled voltage;

calculating a phase difference of a reference signal and the output signal;

generating the controlled voltage based on the calculated phase difference;

outputting a power source;

outputting the specific waveform; and wherein the driving power source is a sum of the output power source and the output specific waveform.

12. The method of claim 11, further comprising dividing the generated output signal at a specific divide ratio and using the divided signal as an output signal input to a phase comparator.

13. The method of claim 11 wherein the specific waveform has various sampling clocks.

14. The method of claim 11, wherein the specific waveform includes a specific noise signal.

* * * * *